(12) United States Patent
Ebrish et al.

(10) Patent No.: US 10,319,855 B2
(45) Date of Patent: Jun. 11, 2019

(54) REDUCING SERIES RESISTANCE BETWEEN SOURCE AND/OR DRAIN REGIONS AND A CHANNEL REGION

(71) Applicant: INTERNATIONAL BUSINESS MACHINES CORPORATION, Armonk, NY (US)

(72) Inventors: Mona A. Ebrish, Albany, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/714,491

(22) Filed: Sep. 25, 2017

(65) Prior Publication Data

US 2019/0097049 A1  Mar. 28, 2019

(51) Int. Cl.
| | |
|---|---|
| *H01L 29/78* | (2006.01) |
| *H01L 21/265* | (2006.01) |
| *H01L 29/267* | (2006.01) |
| *H01L 21/02* | (2006.01) |
| *H01L 29/66* | (2006.01) |

(52) U.S. Cl.
CPC ...... *H01L 29/7845* (2013.01); *H01L 21/0245* (2013.01); *H01L 21/26506* (2013.01); *H01L 21/26586* (2013.01); *H01L 29/267* (2013.01); *H01L 29/6659* (2013.01); *H01L 29/7833* (2013.01)

(58) Field of Classification Search
CPC ............. H01L 29/7845; H01L 21/0245; H01L 21/26506; H01L 21/26586; H01L 29/267; H01L 29/6659; H01L 29/7833

USPC .................................................. 257/403, 438
See application file for complete search history.

(56) References Cited

U.S. PATENT DOCUMENTS

| | | |
|---|---|---|
| 5,767,557 A | 6/1998 | Kizilyalli |
| 6,268,640 B1 | 7/2001 | Park et al. |
| 6,849,527 B1 | 2/2005 | Xiang |
| (Continued) | | |

FOREIGN PATENT DOCUMENTS

| | | |
|---|---|---|
| CN | 101908561 A | 12/2010 |
| CN | 102403353 A | 4/2012 |

OTHER PUBLICATIONS

Onoda et al., "High Dose Dopant Implantation to Heated Si Substrate without Amorphous Layer Formation," Ext. Abs. the 13th International Workshop on Junction Technology 2013. Jun. 6-7, 2013. pp. 66-69.

(Continued)

*Primary Examiner* — Hrayr A Sayadian
(74) *Attorney, Agent, or Firm* — Tutunjian & Bitetto, P.C.; Vazken Alexanian

(57) ABSTRACT

A method for reducing series resistance for transistors includes forming a conductive gate over and insulated from a semiconductor substrate, forming source and/or drain extension regions within the substrate and adjacent to respective source and/or drain regions, and forming source and/or drain regions within the substrate. The source and/or drain extension regions are formed from a material alloyed with a first dopant and a second dopant, the first dopant configured to increase a lattice structure of the material forming the source and/or drain extension regions.

9 Claims, 9 Drawing Sheets

(56) References Cited

U.S. PATENT DOCUMENTS

| | | |
|---|---|---|
| 2005/0112835 A1* | 5/2005 | Sa .................... H01L 21/26506 438/305 |
| 2005/0112857 A1* | 5/2005 | Gluschenkov ...... H01L 29/0847 438/585 |
| 2008/0230844 A1 | 9/2008 | Yu et al. |
| 2012/0309137 A1 | 12/2012 | Cai et al. |
| 2015/0054031 A1 | 2/2015 | Glass et al. |
| 2015/0179793 A1 | 6/2015 | Denison et al. |
| 2016/0013297 A1 | 1/2016 | Lu et al. |
| 2016/0284847 A1 | 9/2016 | Chau et al. |

OTHER PUBLICATIONS

Trumbore et al., "Solid Solubilities of Impurity Elements in Germanium and Silicon," Meeting of the Electrochemical Society of Philadelphia. May 4, 1959. pp. 205-233.

International Search report issued in PCTIB2018057275 dated Jan. 21, 2019, 9 pages.

* cited by examiner

REDUCING SERIES RESISTANCE BETWEEN SOURCE AND/OR DRAIN REGIONS AND A CHANNEL REGION

BACKGROUND

Technical Field

The present invention relates generally to semiconductor devices, and more specifically, to reducing series resistance between source and/or drain regions and a channel region.

Description of Related Art

For decades, geometrical scaling of transistor components yielded increased transistor performance and higher density at the same time. However, in a scaled-down transistor, inaccurate placement of dopants and junctions limits transistor performance. Diffused junctions and gradual dopant profiles often result in poor transistor gate control and degraded performance thus offsetting any benefit from geometrical scaling. The transistor gate control is often measured in terms of Drain Induced Barrier Lowering (DIBL) or the difference between the transistor threshold voltage measured in linear and saturation mode of operation. Abruptness of the dopant profiles and the placement of the dopant with respect to the gate edge directly control DIBL and series resistance of the transistor. A higher concentration of electrically active dopants in the proximity of gate edge improve transistor series resistance but can degrade (increase) DIBL. Transistors with the sharper lateral dopant profiles allow for improved series resistance without degrading DIBL. Though the invention applies for all transistor structures, fin field effect transistors (FinFET) are used as an example emerging technology which provides solutions to field effect transistor (FET) scaling problems. FinFET structures include at least one narrow semiconductor fin gated on at least two sides of each of the at least one semiconductor fin. FinFET devices having multiple fins covered by a single gate have been developed to increase a width of a channel region and a drive current of such multi-fin transistor.

SUMMARY

In accordance with an embodiment, a structure for reducing series resistance for transistors is provided. The structure includes a conductive gate formed over and insulated from a semiconductor substrate, source and/or drain regions formed within the substrate, and source and/or drain extension regions formed within the substrate and adjacent to respective source and/or drain regions. The source and/or drain extension regions are formed from a material alloyed with a first dopant and a second dopant, the first dopant configured to increase a lattice structure of the material forming the source and/or drain extension regions.

In accordance with an embodiment, a method for reducing series resistance for transistors is provided. The method includes forming a conductive gate over and insulated from a semiconductor substrate, forming source and/or drain extension regions within the substrate and adjacent to respective source and/or drain regions, and forming source and/or drain regions within the substrate. The source and/or drain extension regions are formed from a material alloyed with a first dopant and a second dopant, the first dopant configured to increase a lattice structure of the material forming the source and/or drain extension regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
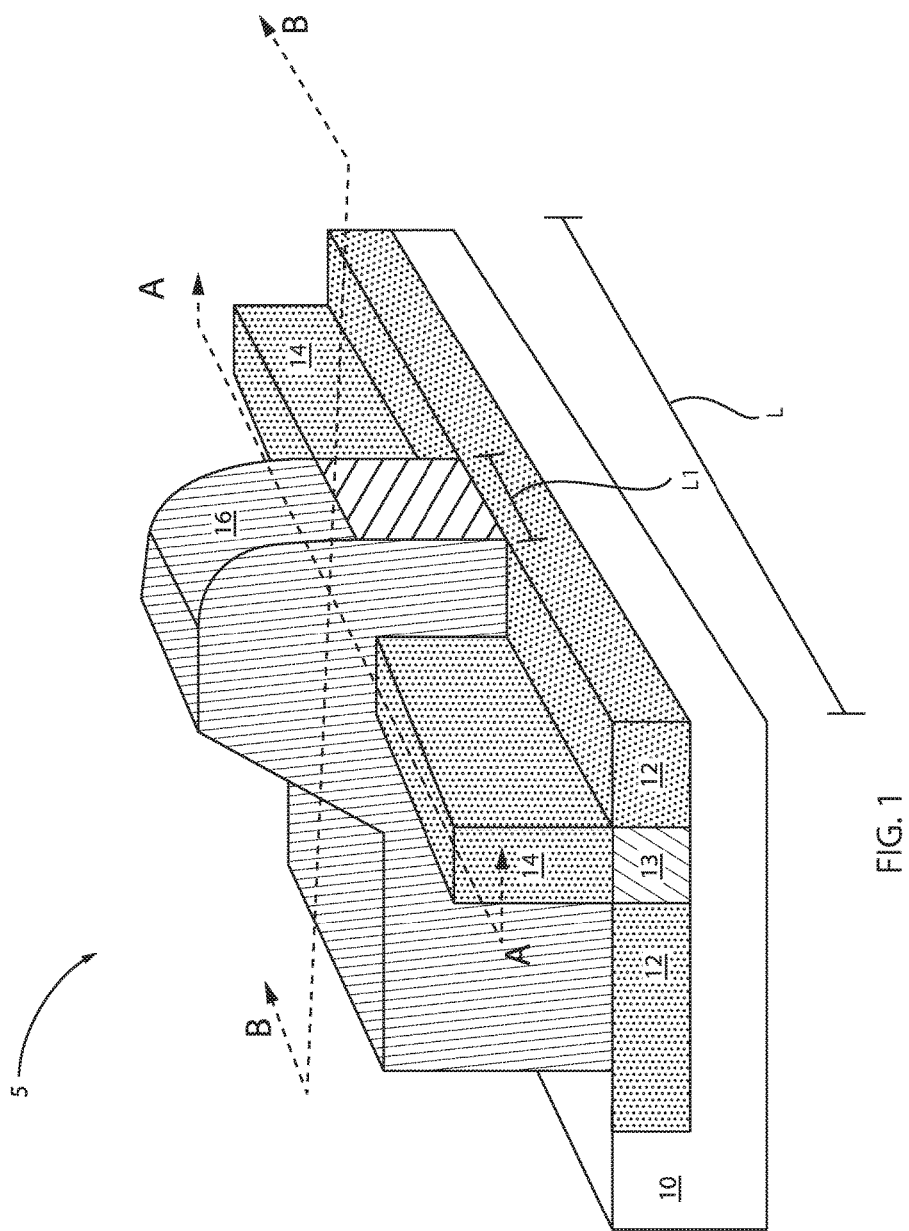
FIG. 1 is a perspective view of a fin formed over a substrate, in accordance with the present invention.

Embodiments in accordance with the present invention provide methods and devices for reducing resistance between source and/or drain regions and a channel region for a transistor. To minimize resistance in the source and/or drain regions, extension regions are doped to modify their chemical composition. In one example, the extension regions can be doped with at least two elements. The addition of such elements or dopants modifies a lattice structure of the extension region. The transistors can be, e.g., fin field effect transistors (FinFETs) or vertical field effect transistors (VFETs) or tunnel FETs or nanosheets.

Embodiments in accordance with the present invention provide methods and devices for adding or introducing or implanting gallium (Ga) and tin (Sn) to an extension region of a transistor at a temperature of about 320° C. or higher. The implantation can be implemented by, e.g., hot ion implantation techniques. For example, by adding Sn, the lattice structure of SiGe becomes larger. By adding Sn into SiGe the Ga solubility can be increased and more Ga atoms can be accommodated in the SiGe lattice. Therefore, the Sn enables higher solubility for the Ga in the SiGe. Ga provides p-type doping and SiGe:Ga:Sn works as a low resistance link-up region from the SiGe:B in the source and/or drain region. Moreover, since Ga scatters less than boron (B), as it is a larger atom, it is more favorable to implant in the extension region of the transistor with the Sn.

Embodiments in accordance with the present invention provide methods and devices for reducing lateral resistance by providing a structure that includes a conductive gate formed over and insulated from a semiconductor substrate, source and/or drain regions formed within the substrate, and source and/or drain extension regions formed within the substrate and adjacent to respective source and/or drain regions. The source and/or drain extension regions are formed from a material implanted with a first dopant and a second dopant, the first dopant configured to increase a lattice structure of the material forming the source and/or drain extension regions. The first dopant can be, e.g., Sn and the second dopant can be, e.g., Ga. The first and second dopants can be implanted by, e.g., hot ion implantation techniques. The implantation of both Ga and Sn in extension regions of a fin-type transistor enable the reduction of lateral resistance in fin-type transistors.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, the extensions regions in a, e.g., pFET region include one element, such as tin (Sn) and another element, such as gallium (Ga) to enable the reduction of lateral resistance in fin-type transistors.

It is to be understood that the present invention will be described in terms of a given illustrative architecture; however, other architectures, structures, substrate materials and process features and steps and/or blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a perspective view of a fin formed over a substrate, in accordance with the present invention.

The semiconductor structure 5 includes a substrate 10. Shallow trench isolation (STI) regions 12 are formed within the substrate 10. A fin is formed over the substrate 10, such that the fin includes an active-fin region 14 and a sub-fin region 13. The sub-fin region is formed adjacent the STI regions 12. The active-fin region 14 extends a length "L" across the substrate 10. A gate structure 16 is formed over a portion of the active-fin region 14. The gate structure 16 is formed substantially perpendicular to the active-fin region 14. The gate structure 16 extends a length "L1" over the substrate 10.

In one or more embodiments, the substrate 10 can be a semiconductor or an insulator with an active surface semiconductor layer. The substrate 10 can be crystalline, semi-crystalline, microcrystalline, or amorphous.

The fins 14 can have a width of approximately 3 nm to approximately 100 nm, preferably approximately 4 nm to approximately 20 nm. In a preferred embodiment, the fins 14 can have a width in the range of approximately 5-12 nm. The fins 14 can have a height of approximately 3 nm to approximately 300 nm, preferably approximately 10 nm to approximately 100 nm. In a preferred embodiment, fin 14 can be fabricated to include a height in the range of approximately 40 nm to approximately 80 nm. In some embodiments, a hard mask layer (not shown) can be incorporated into the etching process to protect the fins 14 during their formation, and also during subsequent processing steps.

The gate 16 can include a gate dielectric and a gate conductor that can be formed via any known process in the art, including a gate-first process and a gate-last process. The gate structure can have a height of approximately 40 nm to approximately 200 nm, preferably approximately 50 nm to approximately 150 nm.

Figure 2:
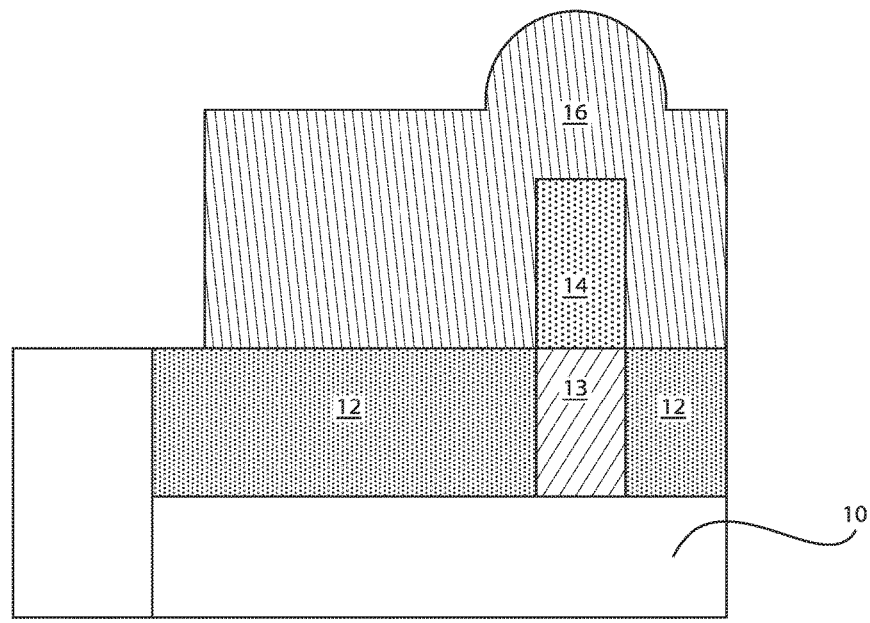
FIG. 2 is a cross-sectional view of FIG. 1 along axis B-B, in accordance with the present invention.

FIG. 2 is a cross-sectional view of FIG. 1 along axis B-B, in accordance with the present invention.

The cross-sectional view of FIG. 1 along axis B-B illustrates STI regions 12 formed over substrate 10, as well as the sub-fin region 13 formed between the STI regions 12. The active-fin region 14 is formed over the sub-fin region 13, and is undoped or lightly doped ($1 \times 10^{18}$ cm$^{-3}$) with the dopant opposite to transistor type, e.g., phosphorus or arsenic (n-type) for pFET. The gate structure 16 is shown over the STI regions 12 and on a common plane with the active-fin region 14. The extension regions 22/22' are doped with the dopant of the same type as the transistor, e.g., boron for pFET. The concentration of the dopant in the extension region is preferably higher than the concentration of inversion free charge in the channel region ($2-3 \times 10^{19}$ cm$^{-3}$), and, preferably, 2-3 times higher.

Figure 3:
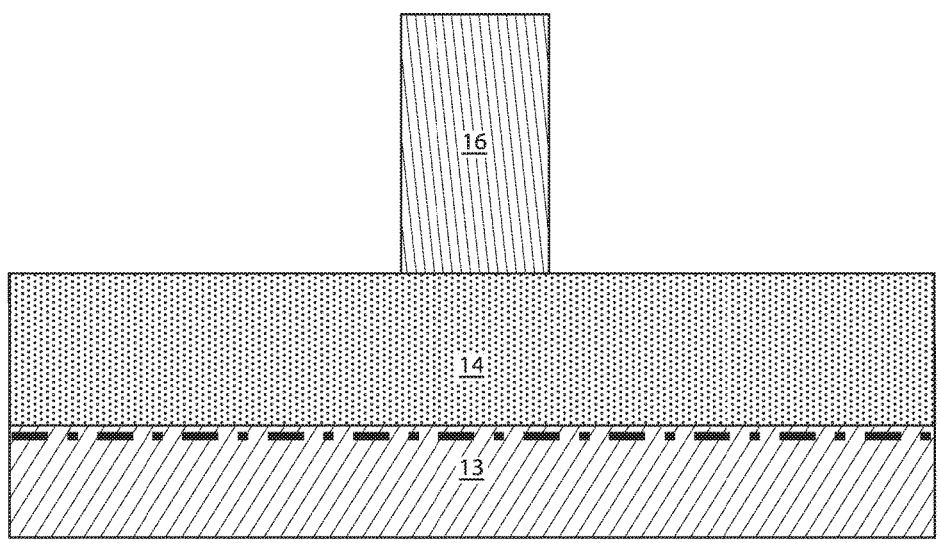
FIG. 3 is a cross-sectional view of FIG. 1 along axis A-A, in accordance with the present invention.

FIG. 3 is a cross-sectional view of FIG. 1 along axis A-A, in accordance with the present invention.

The cross-sectional view of FIG. 1 along axis A-A depicts the sub-fin region 13, the active-fin region 14 formed over the sub-fin region 13, and the gate structure 16 formed over the active fin 14. In one example embodiment, the active fin 14 can be formed from silicon germanium (SiGe).

Figure 4:
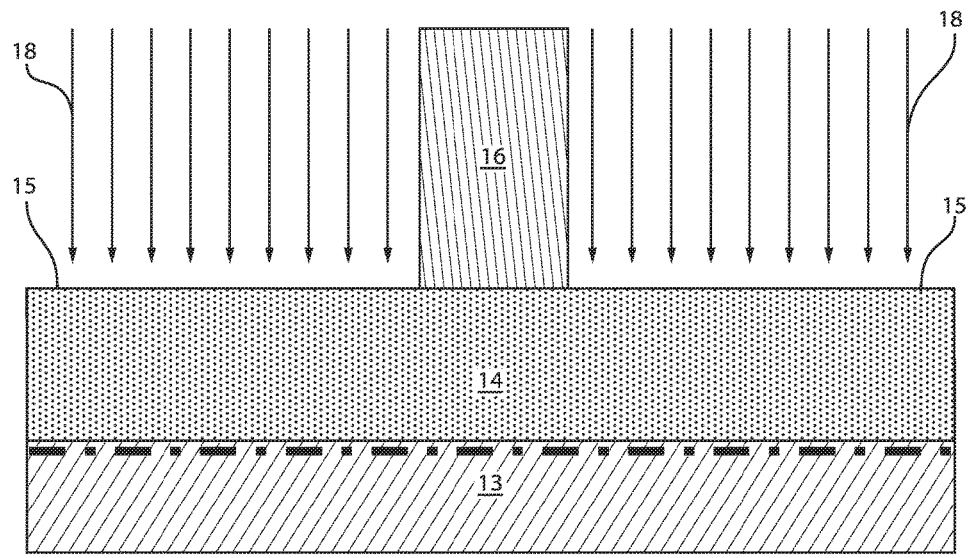
FIG. 4 is a cross-sectional view of FIG. 3 where tin (Sn) is introduced in the extension region, in accordance with the present invention.

FIG. 4 is a cross-sectional view of FIG. 3 where tin (Sn) is introduced in the extension region via angular implant, in accordance with the present invention.

In order to improve abruptness of the dopant profile near the gate edge (profile 42 vs 44 in FIG. 14), a high-Z (high atomic mass or atomic number) dopant atom is used to suppress its straggle and diffusion. For pFET, a high-Z p-type dopant atom means an atom with Z higher than 13 (Z for Al), such as Ga (Z=31, M=70) or In (Z=49, M=115) with Ga being preferred. For nFET, high-Z n-type dopant atom means an atom with Z higher than 33 (Z for As), such as Sb (Z=51, M=122).

Unfortunately, "high Z" dopant atoms suffer from poor chemical solubility in underlying group IV semiconductors, specifically, semiconductors with smaller Z such as Si (Z=14). By way of example, the maximum chemical solid solubility of Ga in Si is $3\times10^{19}$ cm$^{-3}$, while in Ge it is $4\times10^{20}$ cm$^{-3}$. SiGe will have Ga chemical solubility in between that of Si and Ge. If the fin/channel material is Si or SiGe with low % Ge (<30%), the relatively low solubility of Ga limits its effective use as the extension dopant since the concentration of hole (active dopant concentration) would not exceed the chemical solubility of dopant and it will be less than the desired level of 2-3× the inversion charge concentration. Furthermore, any Ga atoms in excess of its chemical solubility in such semiconductor will precipitate out during subsequent thermal steps causing undesirable inclusions of metallic Ga within the fin body. Antimony (Sb) has the chemical solubility of ~$5\times10^{19}$ cm$^{-3}$ in silicon (Si). Its solubility will first increase with enlarging Si crystal lattice spacing but then drop to ~$1\times10^{19}$ cm$^{-3}$ in pure germanium. Accordingly, if the fin/channel material is Si for nFET, Sb extension doping will benefit from slightly increasing Si lattice spacing in the extension region. Alternatively, if the fin/channel material is Ge or SiGe with high % Ge (>70%) for nFET, Sb extension doping will benefit from slightly decreasing SiGe lattice spacing in the extension region.

To overcome the "high Z" dopant solubility limitation, the extension region will be made from a semiconductor with a different lattice spacing than that of the channel and/or source drain material. In one example of a pFET, the extension region needs to be made from a semiconductor with a larger lattice spacing than that of the channel by either increasing Ge content, by alloying it with tin, or both. In the case of Ge or SiGe nFET with high % Ge (>70%), a decrease in the lattice spacing is needed by decreasing Ge content and/or alloying with carbon. Increasing Ge content and/or alloying it with tin causes a decrease in the lattice spacing. In the case of a Si based fin structure nFET, the extension region needs to be made from a semiconductor with a larger lattice spacing, by alloying it with tin (Sn) for example. Tin alloying is attractive since adding 1 atomic % of tin to $Si_{0.75}Ge_{0.25}$, for instance, is roughly equivalent to adding 5 atomic % of Ge for the purpose of enlarging SiGe lattice spacing, in other words, making lattice spacing equivalent to that of $Si_{0.7}Ge_{0.3}$. However, the solubility of Sn in SiGe is also limited by several atomic percent. By way of example, the maximum chemical solid solubility of Sn in Si is ~$6\times10^{19}$ cm$^{-3}$ or ~1 atomic %, while in Ge is $5\times10^{20}$ cm$^{-3}$ or 3 atomic %. SiGe will have Sn chemical solubility in between that of Si and Ge. Metastable, homogeneous SiGeSn alloys, those with the concentration of Sn exceeding its maximum chemical solubility in SiGe, can be created by various non-equilibrium processes such as ion implantation and low-temperature epitaxial growth but are not stable at high temperature and will decompose into a stable SiGeSn alloy with the Sn concentration below that of its maximum chemical solubility and metallic tin inclusions or precipitates. Shortening duration of any high-temperature post formation anneals and limiting the amount of tin above its maximum chemical solubility allows for preserving a moderately metastable SiGeSn compound with a larger lattice spacing where the concentration of Sn is less than twice of its maximum chemical solubility in SiGe.

In various embodiments, a first dopant 18 is implanted into the extension region 14 via angular implant 15. The dopant can be, e.g., tin (Sn). The purpose of this dopant is to increase lattice spacing of extensions regions 14 leading to the increased chemical solubility of an electrically active "high-Z" dopant. The resultant preferred Sn content in the extension region 14 is between about 0.5 to about 1.5 atomic percent (at %) resulting in increased Ga solubility of from about $2\times10^{19}$ cm$^{-3}$ to about $1\times10^{20}$ cm$^{-3}$. The dose, energy, and tilt and twist angles of Sn implant are selected in such a way that the resultant Sn concentration in the extension regions 14 is from about $5\times10^{19}$ cm$^{-3}$ to about $1.5\times10^{20}$ cm$^{-3}$ or from about 0.5 at % to about 1.5 at %, In a preferred embodiment, the Sn implant dose is from about $3\times10^{14}$ cm$^{-2}$ to about $2\times10^{15}$ cm$^{-2}$, the Sn implant energy is from about 1 keV to about 7 keV, and the Sn implant tilt angle is from about 3 degrees to about 10 degrees, and the twist angles are chosen in such a way that the implant is conducted perpendicular to the fin from both of its sides.

Figure 5:
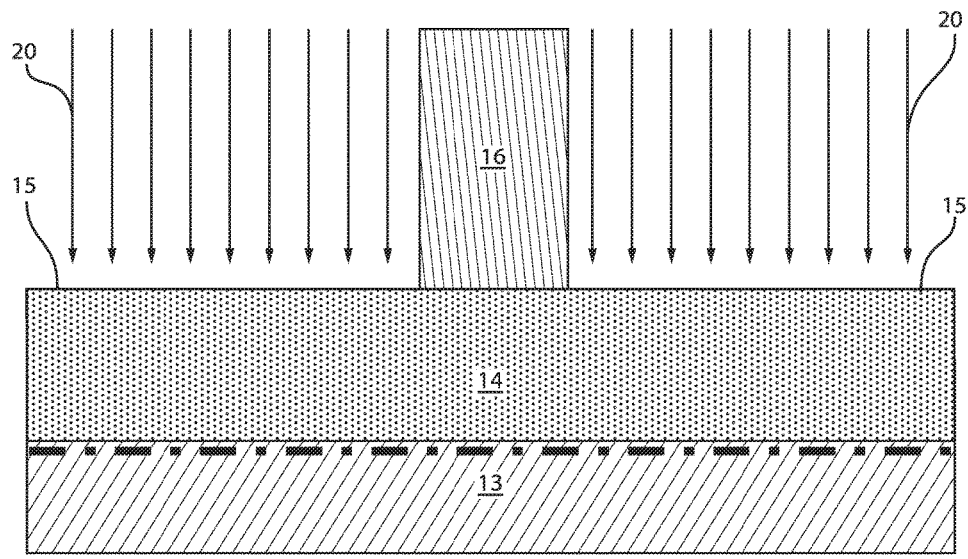
FIG. 5 is a cross-sectional view of FIG. 4 where gallium (Ga) is introduced in the or extension region, in accordance with the present invention.

FIG. 5 is a cross-sectional view of FIG. 4 where gallium (Ga) is introduced in the extension region via angular implant 15, in accordance with the present invention.

In various embodiments, a second dopant 20 is implanted into the extension region. The dopant can be, e.g., gallium (Ga). The dose, energy, and tilt and twist angles of Ga implant are selected in such a way that the resultant Ga concentration in the extension regions 14 is from about $2\times10^{19}$ cm$^{-3}$ to about $1\times10^{20}$ cm$^{-3}$. In a preferred embodiment, the Ga implant dose is from about $1\times10^{14}$ cm$^{-2}$ to about $1\times10^{15}$ cm$^{-2}$, the Ga implant energy is from about 0.5 keV to about 7 keV, and the Ga implant tilt angle is from about 3 degrees to about 10 degrees, and the twist angles are chosen in such a way that the implant is conducted perpendicular to the fin from both of its sides.

The first and second dopants 18, 20 can be implanted by, e.g., hot ion implantation techniques at a substrate temperature of about 320° C. or higher. The purpose of an elevated substrate temperature during the implantation process is to avoid a complete amorphization of crystalline fin structure by implanting "high-Z" ions into its structure. Accordingly, the substrate temperature during the implantation process is chosen based on implanted ion size with larger ions requiring higher temperature. In a preferred embodiment, the substrate temperature during Sn implant is equal or above about 450° C. while during Ga implant is equal or above about 320° C. The implantation processes are typically conducted with the aid of block masks that block the ion implantation for some transistors (e.g., nFETs) and allow them for other transistors (e.g., pFETs). The block mask material can be capable of withstanding the selected substrate temperature during the implantation processes. In a preferred embodiment, the block mask material is a high-temperature-stable spin-on organic polymer capable of about 450° C. processing and both implants are conducted at about 450° C. substrate temperature. Optionally, an anneal can occur after the implantation of Sn and Ga to heal introduced crystal defects while preserving homogeneity of produced metastable alloys. In one example, the anneal can last for about a few milliseconds and has a peak temperature of about 1200° C.

Figure 6:
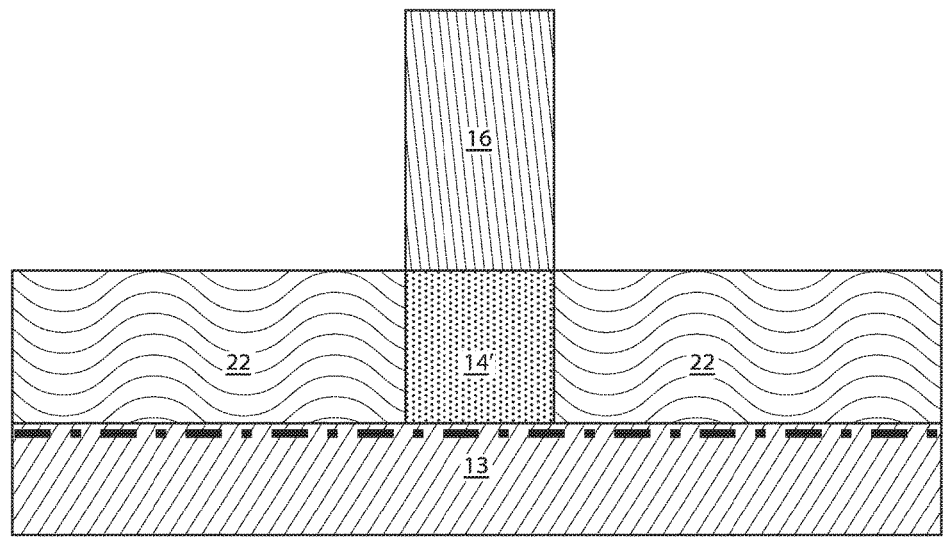
FIG. 6 is a cross-sectional view of FIG. 5 illustrating the extension regions being doped with Sn and Ga, in accordance with the present invention.

FIG. 6 is a cross-sectional view of FIG. 5 illustrating the extension region being doped with Sn and Ga, in accordance with the present invention.

In various embodiments, the extension region is converted to a doped extension region 22. A small non-doped active-fin region 14' remains directly underneath the gate structure 16. As noted above, the extension region is doped with Sn and Ga. Thus, in one example, extension regions 22 include both Sn and Ga.

Figure 7:
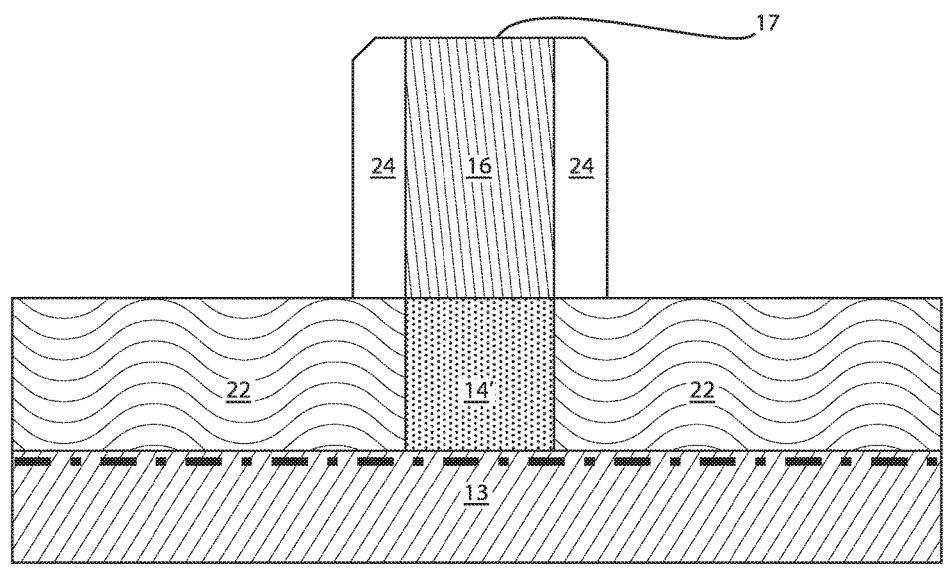
FIG. 7 is a cross-sectional view of FIG. 6, where spacers are formed adjacent a gate structure, in accordance with the present invention.

FIG. 7 is a cross-sectional view of FIG. 6, where spacers are formed adjacent the gate structure, in accordance with the present invention.

In various embodiments, spacers 24 are formed adjacent the gate structure 16. The spacers 24 extend to a top surface 17 of the gate structure 16. The bottom portion of the spacers 24 contact a portion of the doped extension regions 22.

The spacers 24 can be made of, for example, silicon nitride, SiBCN, SiCON, silicon oxide, silicon oxynitrides, or a combination thereof, and can be formed by any method known in the art, including depositing a conformal silicon nitride layer over the gate 16 and etching to remove unwanted material from the horizontal surfaces. The spacers 24 can have a thickness of approximately 1 nm to approximately 10 nm. In some embodiments, the spacers 24 can have a thickness of approximately 1 nm to approximately 5 nm. Optionally, the implants 18, 20 can be conducted after forming spacer 24 or after forming conformal spacer liner.

Figure 8:
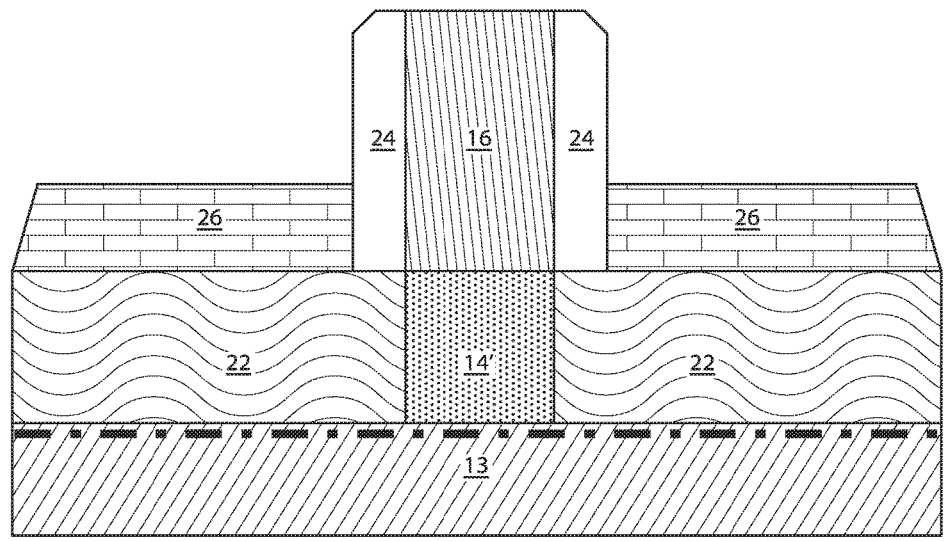
FIG. 8 is a cross-sectional view of FIG. 7 where source and/or drain regions are formed over the doped extension regions, in accordance with the present invention.

FIG. 8 is a cross-sectional view of FIG. 7 where source and/or drain regions are formed over the doped extension regions, in accordance with the present invention.

In various embodiments, source and/or drain regions 26 are formed adjacent the spacers 24 and over the doped extension regions 22. In one example, the source and/or drain regions can include silicon germanium (SiGe) doped with boron (B). In another embodiment, the source and/or drain regions can include silicon germanium (SiGe) doped with boron (B) and carbon (C). The carbon concentration can be less than 2 atomic percent (at. %). The purpose of adding carbon into the source and/or drain regions (and not into the extension regions 22) is to arrest self-interstitials preventing Ga diffusion. The source and/or drain regions 26 can contact or engage an entire upper surface of the extensions regions 22. The source and/or drain regions 26 only contact a portion of a sidewall of the spacers 24.

Figure 9:
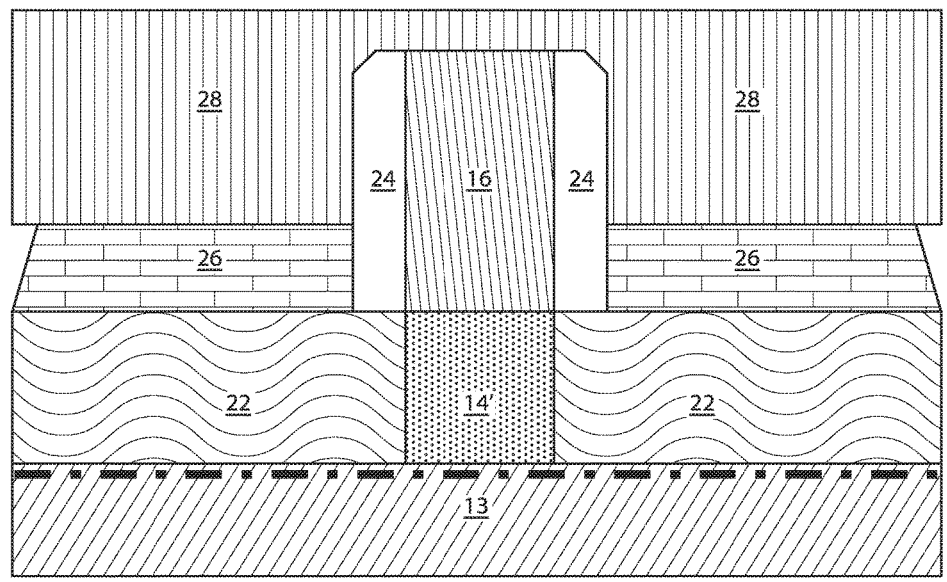
FIG. 9 is a cross-sectional view of FIG. 8 where an inter-level dielectric (ILD) is formed over the source and/or drain regions, in accordance with the present invention.

FIG. 9 is a cross-sectional view of FIG. 8 where an inter-level dielectric (ILD) is formed over the source and/or drain regions, in accordance with the present invention.

In various embodiments, an ILD 28 is deposited over the source and/or drain regions 26, as well as over the gate structure 16 and the exposed portions of spacers 24.

The ILD 28 can be selected from the group including silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

Figure 10:
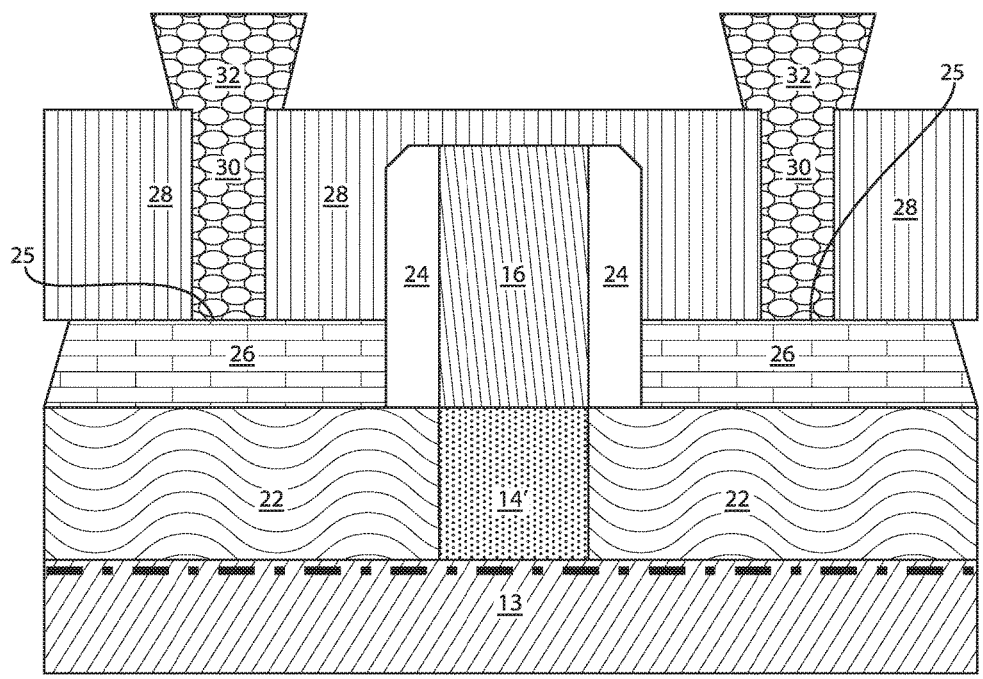
FIG. 10 is a cross-sectional view of FIG. 9 where trenches and vias are formed, in accordance with the present invention.

FIG. 10 is a cross-sectional view of FIG. 9 where trenches and vias are formed, in accordance with the present invention.

In various embodiments, trenches 30 are formed within the ILD 28 that extend up to a top surface 25 of the source and/or drain regions 26. Vias 32 can also be formed over the trenches 30.

Figure 11:
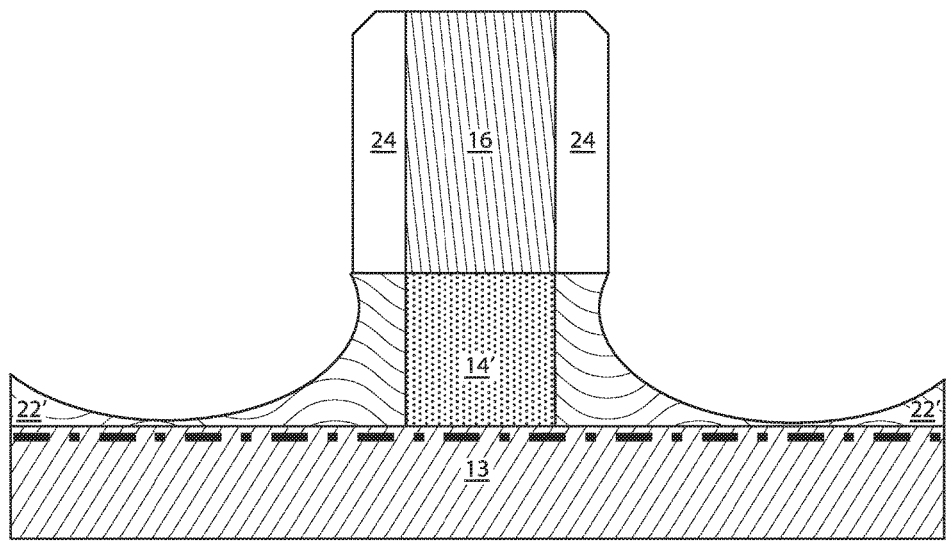
FIG. 11 is a cross-sectional view of FIG. 7 where the doped extension region is recessed, in accordance with another embodiment of the present invention.

FIG. 11 is a cross-sectional view of FIG. 7 where the doped extension region is recessed, in accordance with another embodiment of the present invention.

In various embodiments, after the spacers 24 are formed adjacent the gate structure 16, the doped extension regions 22 can be recessed or etched to doped extension regions 22'. The doped extension regions 22 can be recessed by reactive ion etching (RIE).

Figure 12:
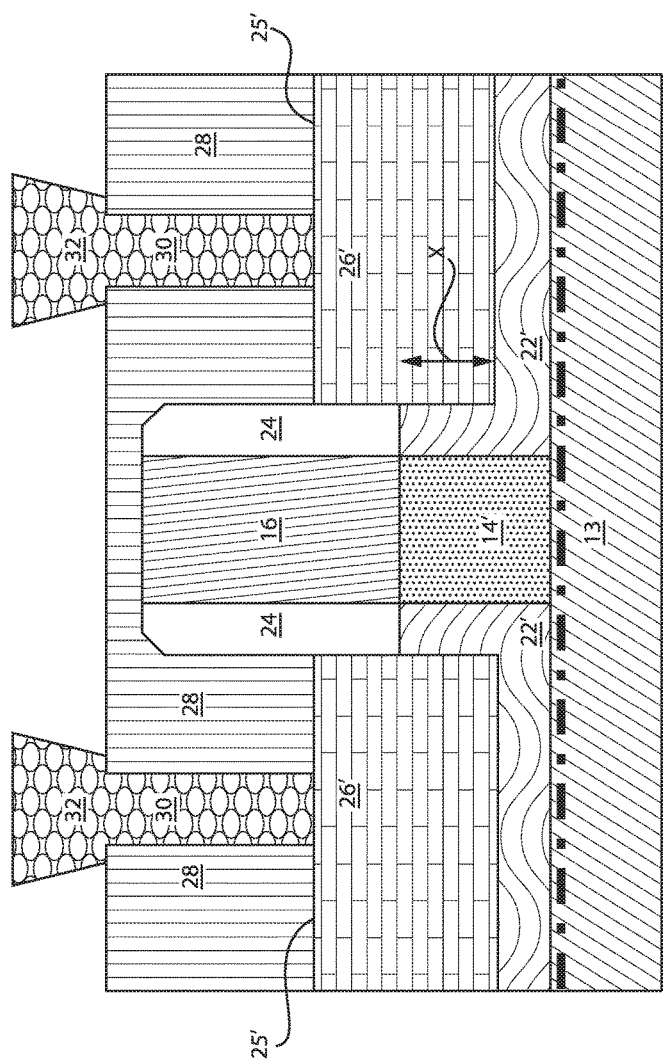
FIG. 12 is a cross-sectional view of FIG. 11 where source and/or drain regions are formed over the doped extension regions, an ILD is deposited over the source and/or drain regions, and trenches/vias are further formed, in accordance with the present invention.

FIG. 12 is a cross-sectional view of FIG. 11 where source and/or drain regions are formed next to the doped extension regions, an ILD is deposited over the source and/or drain regions, and trenches/vias are further formed, in accordance with the present invention.

In various embodiments, source and/or drain regions 26' are formed next to the recessed doped extension regions 22', and an ILD 28 is deposited over the source and/or drain regions 26'. Subsequently, trenches 30 and vias 32 are further formed such that the trenches 30 extend to a top surface 25' of the source and/or drain regions 26'.

The recessed doped extension regions 22' extend a distance "X" below a top surface of the non-doped active-fin region 14' directly underneath the gate structure 16. The recessed doped extension regions 22' remain on the sub-fin active regions 13. In other words, the top surface of the sub-fin region 13 is not exposed. Additionally, the sidewalls of the non-doped active-fin region 14' are not exposed.

Figure 13:
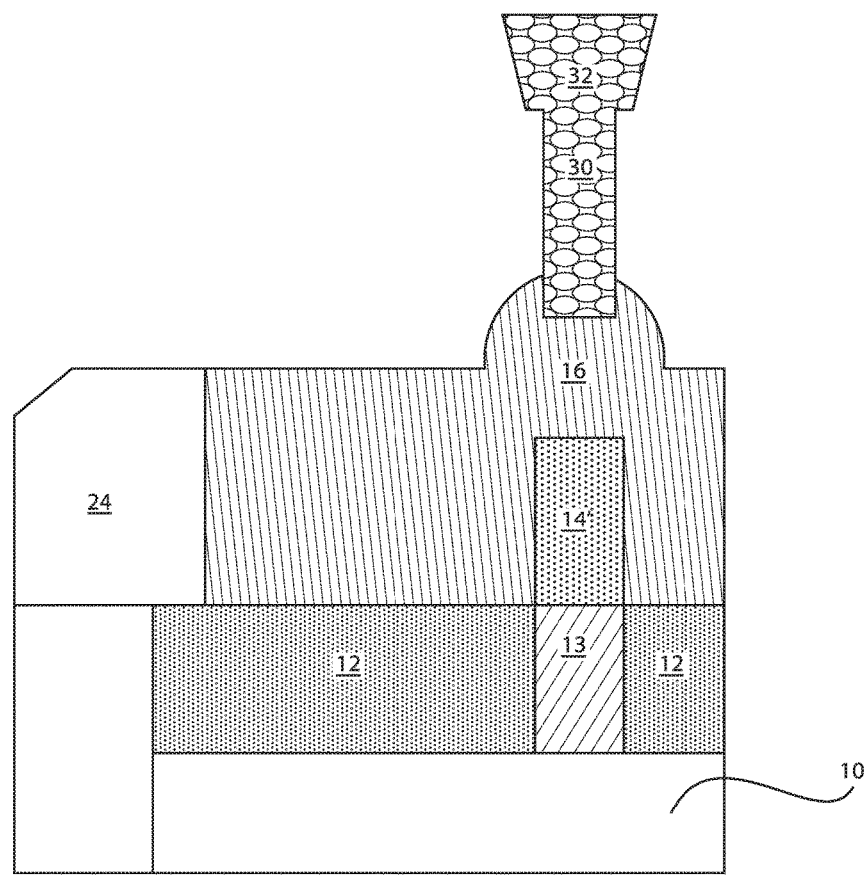
FIG. 13 is a cross-sectional view of FIGS. 10 and 12 taken along axis B-B, in accordance with the present invention.

FIG. 13 is a cross-sectional view of FIGS. 10 and 12 taken along axis B-B, in accordance with the present invention.

In various embodiments, the cross-sectional view of the completed structure illustrates the active-fin region 14' the gate structure 16, as well as the trench 30 and via 32. A spacer 24 is shown adjacent the gate structure 16. The active-fin region 14' is shown directly over the sub-fin region 13.

Figure 14:
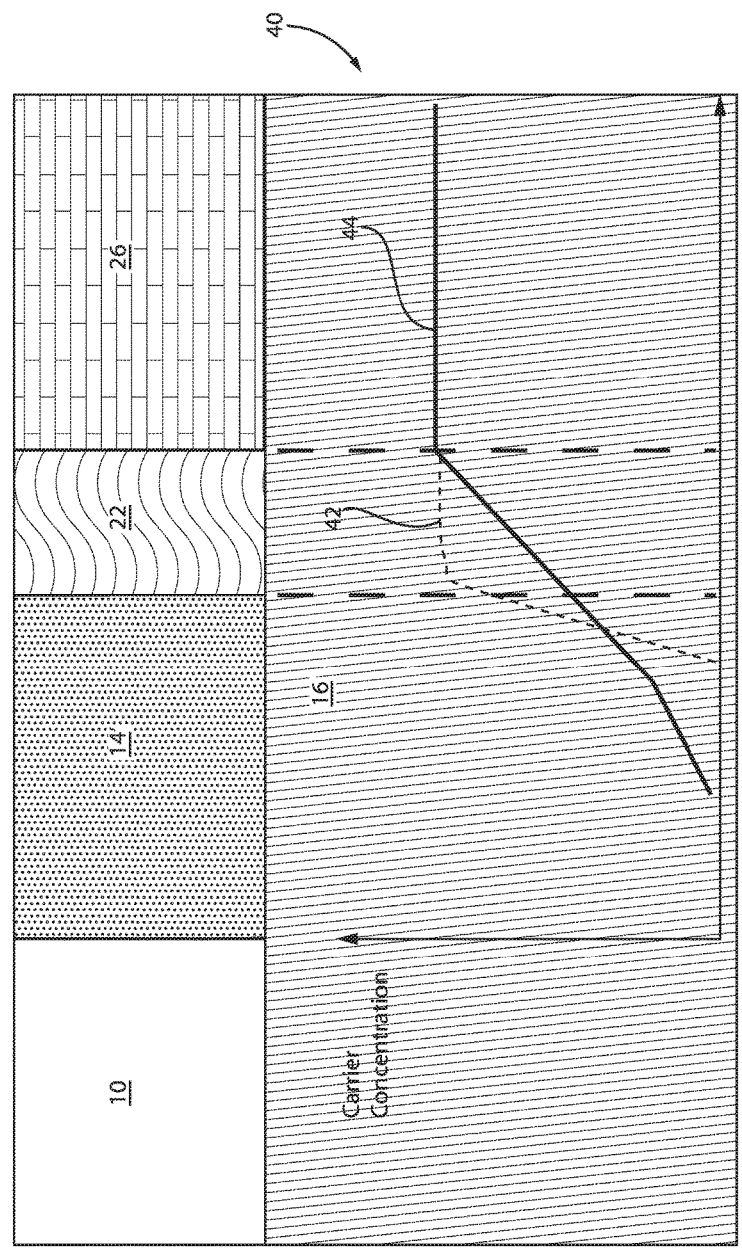
FIG. 14 illustrates graphs of the distribution of gallium (Ga) and boron (B).

FIG. 14 illustrates graphs of the distribution of gallium (Ga) and boron (B).

In various embodiments, graph 40 depicts a carrier concentration profile 42 for Ga and a carrier concentration profile 44 for B. The distribution of B is illustrated by a relatively long chemical profile tail at lower concentrations, whereas the distribution of Ga is illustrated by a relatively sharp chemical profile. The boron atoms are small and thus scatter or straggle long distances. This scattering results in long profile tail in the doped extension regions 22 adjacent to the active-fin region 14' and poor gate control as manifested for improved DIBL, for instance. The gallium atoms are larger atoms (compared to the boron atoms) and do not scatter or straggle long distances. This non-scattering is represented as a sharp profile in the doped extension regions 22 and improved gate control as manifested for improved DIBL, for instance.

Making the extension region from a semiconductor material with different lattice spacing may cause an undesirable disruption of the conductive and/or valence bands (a step) at the entrance to the transistor channel. This disruption causes charged carriers (electrons or holes) to scatter yielding a large resistance at the channel entrance. In order to minimize these undesirable carrier scattering effects, the extension doping is made to extend several nm past the boundary of the extension material with different lattice spacing into the channel. The extension doping of the adjacent channel material can be done at a slightly lower level preventing any precipitation in subsequent thermal steps. For instance, the adjacent channel material can be advantageously doped at or below the solubility limit while the extension region with different lattice spacing can be doped at 2-4 times higher levels. Stated differently, the extension dopant profile into the channel fully contains the profile of alloying material, e.g., tin (Sn), or the extension dopant profile abruptness is less than that of alloying element. In order to reduce channel entrance carrier scattering effects, the alloying element profile can be made relatively gradual such that the disruption in the conductive/valence band is not abrupt. For instance, the abruptness of tin can be made at 2 nm/decade while the abruptness of Ga can be made at 3 nm/decade.

It is to be understood that the present invention will be described in terms of a given illustrative architecture; however, other architectures, structures, substrate materials and process features and steps and/or blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and system for reducing series resistance between source and/or drain regions and a channel region (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A structure for reducing lateral series resistance for transistors, the structure comprising:
    a conductive gate formed over and insulated from a semiconductor substrate;
    a sub-fin region disposed in direct contact with the semiconductor substrate;
    source and/or drain extension regions formed in direct contact with the sub-fin region; and
    source and/or drain regions disposed in direct contact with the source and/or drain extension regions such that the source and/or drain extension regions are located directly between the sub-fin region and the source and/or drain regions;
    wherein the source and/or drain extension regions are formed from a material alloyed with a first element and a second element, the first element configured to increase a lattice spacing of the material forming the source and/or drain extension regions, and the second element configured to increase electrical conductivity of the source and/or drain extension regions.

2. The structure of claim 1, wherein the material forming the source and/or drain extension regions is silicon germanium (SiGe).

3. The structure of claim 2, wherein the first element is tin (Sn) and the second element is gallium (Ga).

4. The structure of claim 3, wherein the Sn enables higher solubility of the Ga in the SiGe forming the source and/or drain extension regions.

5. The structure of claim 3, wherein the Sn has an atomic percentage (at %) between about 0.5 to about 1.5 resulting in Ga concentration of from about $2\times10^{19}$ cm$^{-3}$ to about $1\times10^{20}$ cm$^{-3}$.

6. The structure of claim 5, wherein the Sn is added to SiGe having less than about 70% Ge to make the SiGe appear to have a higher percentage of Ge that allows for a higher concentration of Ga.

7. The structure of claim 1, wherein a channel region is formed under the conductive gate and directly between the source and/or drain extension regions.

8. The structure of claim 7, wherein spacers are formed adjacent the conductive gate such that the source and/or drain extension regions directly contact the spacers.

9. The structure of claim 1, wherein the source and/or drain regions are doped with boron (B) and carbon (C).

* * * * *